United States Patent [19]

Meuleman et al.

[11] 4,124,411

[45] Nov. 7, 1978

[54] METHOD OF PROVIDING A LAYER OF SOLID MATERIAL ON A SUBSTRATE IN WHICH LIQUID FROM WHICH THE SOLID MATERIAL CAN BE FORMED, IS SPREAD OVER THE SUBSTRATE SURFACE

[75] Inventors: Johannes Meuleman, Caen; Jean-Pierre Besselere, Plumetot-par-Douvres, both of France

[73] Assignee: U.S. Philips Corporation, New York, N.Y.

[21] Appl. No.: 720,009

[22] Filed: Sep. 2, 1976

[51] Int. Cl.² .......................................... H01L 31/00
[52] U.S. Cl. .................... 136/89 TF; 427/86; 427/240; 427/241; 148/171; 427/87
[58] Field of Search ............... 427/240, 241, 86, 184, 427/72, 74, 347; 118/52, 53, 54; 136/89 TF

[56] References Cited

U.S. PATENT DOCUMENTS

| | | | |
|---|---|---|---|
| 2,021,485 | 11/1935 | Huebner | 427/240 |
| 3,031,339 | 4/1962 | Regan et al. | 118/53 |
| 3,364,054 | 1/1968 | Weingarten | 427/72 |
| 3,467,059 | 9/1969 | Korner et al. | 427/240 |
| 3,653,941 | 4/1972 | Bell et al. | 427/72 |
| 3,656,453 | 4/1972 | Tousimis | 118/53 |

FOREIGN PATENT DOCUMENTS 573,132  3/1959  Canada ......................... 427/72

OTHER PUBLICATIONS

Anon - Research Disclosure No. 10250, Dec. 1972.

*Primary Examiner*—John T. Goolkasian
*Attorney, Agent, or Firm*—Frank R. Trifari; Norman N. Spain

[57] ABSTRACT

A method of providing a layer of solid material, in particular semiconductor material, in which drops of a liquid from which the solid material is deposited, is dropped and spread on a flat surface which is given a rotating movement and also another periodic movement, changing the position of the plane of the substrate surface.

16 Claims, 2 Drawing Figures

METHOD OF PROVIDING A LAYER OF SOLID MATERIAL ON A SUBSTRATE IN WHICH LIQUID FROM WHICH THE SOLID MATERIAL CAN BE FORMED, IS SPREAD OVER THE SUBSTRATE SURFACE

The present invention relates to a method of providing a layer of solid material on a flat substrate surface, in which a liquid material from which the solid material is formed, is supplied dropwise to the substrate while the substrate is given a rotating movement.

The invention relates in paeticular to the manufacture of slices and layers of a semiconductor material, especially silicon, of large area to manufacture semiconductor devices, in particular solar cells.

The use of solar energy as a competitor for the other usual sources of energy, or to replace same, is at present still restricted, in particular due to the high cost-price of the devices for receiving and converting said energy. It is endeavoured in particular for the manufacture of solar cells to develop production methods with which their cost-price can be reduced considerably as compared with the current methods. For example, in the manufacture of silicon solar cells the method for the manufacture of monocrystalline plates from which the said cells are manufactured, is still complicated. First, moncrystalline silicon rods are manufactured which are then divided into wafers by sawing, said wafers are polished so as to remove the layers damaged by the sawing operation. In each of these long and expensive operations a part of the silicon is lost; moreover, losses as a result of the numerous quality checks which are inevitable in each stage of manufacture should be taken into account. The complicated character and the duration of the preparation processes, the high final loss percentage of silicon (in the order of 50% by weight with respect to the polycrystalline starting material) cause the manufacture of solar cells of monocrystalline material to be rather expensive.

It has therefore been tried to develop methods for the manufacture of solar cells of polycrystalline material in which the manufacture of monocrystalline rods and the subsequent sawing operations, and possibly even certain surface treatments, may be omitted and in which nevetheless wafers or layers provided on substrates can be obtained of which the quality of the surface and the purity are acceptable. As a matter of fact it is known that the efficiency of the conversion of light energy into electrical energy of solar cells of polycrystalline material can reasonably approach that of the monocrystalline solar cells if the polycrystalline material is of a reasonable quality.

A method of manufacturing wafers of semiconductor material of a great purity for the manufacture of solar cells is described in French Patent Specification No. 1,374,335. According to this method the semiconductor material which is provided in powder form in a layer of a small and uniform thickness on a flat support is exposed to an electron bombardment according to a moving strip; this bombardment produces a melting of the surface of the grains which clot together and form a polycrystalline layer of a small thickness.

Such a method permits of obtaining a layer of good purity, as described in the said patent. Said method requires a comparatively expensive apparatus and should be carried out accurately so as to obtain a readily coherent layer.

It is the object of the present invention to provide a method in which layers can be provided in a simple manner on a substrate of a substantially large area, in particular layers of semiconductor material, and especially for use in the manufacture of solar cells.

The invention uses a known method of providing a layer of solid material on a flat substrate surface, in which a liquid material from which the solid material is formed is provided dropwise on the substrate while the substrate is given a rotating movement. Such a method is used, for example, in semiconductor technology for providing a layer of photolacquer on a substrate. By rotation of the substrate the photolacquer which is provided in dropform is spread over the surface. It has been found, however, that in practice a layer provided in this manner may be non-uniformly distributed over the surface, in which the layer thickness in the place of passage of the axis of rotation may differ from the layer thickness in more peripheral places of the substrate. This may be the case in particular if the liquid material has a high surface tension and a further object of the invention is to obtain a better distribution of the material over the substrate surface.

According to the invention, a method of providing a layer of solid material on a flat substrate surface in which a liquid material from which the solid material is formed is provided dropwise on the substrate, while the substrate is given a rotating movement, is characterized in that the rotating movement of the substrate is combined with at least one other periodic movement which produces a change of the position of the plane of the substrate surface, such that the points of the surface which are situated outside the point of passage of the axis of the rotating movement, change in height with respect to said point of passage.

A homogeneous spreading is further promoted when the frequencies of the said rotating movement and the said other periodic movement are chosen to be different. The frequency of the other periodic movement is preferably chosen to be larger than the frequency of the first-mentioned rotating movement. In that case the rotating movement may be restricted so as to prevent liquid from hurling away off the substrate, while by the combination with the more rapid other periodic movement a rapid spread of the dropped liquid material can be obtained.

In principle the axis of rotating of the rotating movement can remain vertical, whereas the other periodic movement varies the position of the plane relative to said axis of rotation, for example, by using a tilting movement.

According to a preferred embodiment the axis of the rotating movement remains at right angles to the substrate surface and the said other period movement varies the position of the axis of the said rotating movement simultaneously with the position of the plane of the substrate surface. According to a preferred embodiment the other movement may also be a tilting movement, preferably with extreme positions which enclose an angle of the same value with the intermediately located horizontal position. The angle of tilt, that is the angle which the said two extreme positions enclose with each other, may be small to obtain already a noticeable improvement of the spreading of the dropped liquid. When the angle of tilt is too large the danger exists of the occurrence of a continuously varying local thickness variation and of the flowing away of liquid from the substrate surface. Suitable values of the angle between two extreme positions of the substrate surface may be chosen, for example, between 3° and 10°.

In the case in which the axis of the rotating movement always remains directed according to the normal to the substrate surface, according to another preferred embodiment the other periodic movement may be chosen to be another rotating movement which varies the position of the plane of the substrate surface the axis of rotation of the said other rotating movement enclosing an angle with the normal to the substrate surface, for example, said axis being vertical whereas the positions of the substrate surface are inclined. The said angle may also be chosen to be comparatively small, preferably in the case in which a partical flowing away of the dropped liquid should preferably be obtained. Suitable values of said angle may be chosen, for example, between 1.5° and 5°.

By the combination of a rotating movement and another periodic movement which varies the position of the plane of the substrate surface, it is possible, according to a preferred embodiment, to drop eccentrically of the axis of rotation of the rotating movement, which means that the position where the liquid material is dropped on the substrate surface is situated outside the axis of the rotating movement. As a result of this, the possibility of undesired thickening of the provided material at the area of the axis of rotation where the centrifugal effect is minimum, is further reduced. It is to be noted that in the known application of only a rotating movement, in eccentric dropping the substrate, as a result of the centrifugal effect, may remain uncovered at the area of the axis of rotation. As a result of the added periodic movement, use is made of the additional effect of gravity for the flow of liquid towards the place of passage of the axis of rotation.

The distance between the passage of the axis of rotation and the average point of impact of the liquid drop(s) is also decisive of the time in which the whole substrate is covered with the dropped material. For optimum covering the most favourable distance will be chosen in accordance with the size of the substrate. For a circular substrate surface, the above-mentioned distance may, for example, be chosen between 1/10 and ½, preferably between 1/5 and ¼ of the diameter of the substrate surface.

The method according to the invention may be used to obtain layers of various solids, for example, layers of synthetic resins, for example by hardening of monomeric or (partially) pre-polymerized liquid starting material, thermoplastic material which can be heated to the liquid state, in solvents, in particular in volatile solvents, soluble solid material. The method may be applied in particular to meltable material in which the material, which is added dropwise, is solidified after or already during spreading over the surface. The substrate may be heated to just below the melting point of the material of the layer to be provided in such manner that solidification occurs sufficiently slowly to be able to spread the material in the still liquid condition. In the case of a crystalline material the method according to the invention permits in particular of obtaining layers of non-porous substantially structure, for example, substantially homogeneous polycrystalline structure having a smooth usually even reflective surface. Also for the above-mentioned reasons the method according to the invention has proved to be particularly suitable for providing layers of semiconductors material having a fairly large area. Although in general the semiconductor material is in this manner obtained in a polycrystalline form, the layers nevertheless prove to have an acceptable quality for the manufacture of cheap semiconductor devices, in particular solar cells, with a reasonable efficiency. Mechanical treatments of the surface of the formed layer may be omitted. The method has even proved suitable for the formation of silicon layers of acceptable semiconductor quality, notwithstanding the very high melting-point of silicon.

The choice of the frequencies of the rotating movement and of the other periodic movement may favourably be chosen on the basis of experiments. Good results have been obtained, for example, with frequencies of the first-mentioned rotating movement between 15 and 30 rpm and frequencies of the other periodic meovements between 3 and 6 oscillations per second.

As regards the volume of the liquid, this may corresponds to one or several drops of liquid material; in the case of several drops for the treatment of the same laminar body, the frequency of the falling drops should be chosen to a sufficiently rapid value to achieve that the formation of the solid material occurs substantially continuously. Otherwise, the rate of crystallization for meltable crystalline material may be influenced by a more or less high heating of the substrate.

It has proved possible with the method according to the invention to form layers the diameter of which is 100 mm and the thickness of which is between 10 and 400 μm.

With such layers of semiconductor material, in particular of silicon, solar cells of a reasonably large area can be cheaply manufactured. The semiconductor material in the liquid state may be doped in such manner that the semiconductor layer which is obtained from this material may obtain a desired extrinsic conductivity type. The solid semiconductor layer may then be subjected to a diffusion treatment so as to form therein a surface zone the conductivity type of which is opposite to the original type so that a $p$-$n$ junction of large area is obtained. The formed layer preferably remains connected to the substrate on which it is crystallized, which substrate gives the semiconductor layer mechanical rigidity. For a silicon layer a substrate of graphite may preferably be chosen in known manner which substrate of graphite may form an ohmic contact with the layer. A second contact which preferably should be sufficiently permeable to solar rays, is provided on the surface where the surface zone of the opposite conductivity type is formed. In principle, it is alternatively possible to form a self-supporting layer which can be removed from the substrate.

It will be obvious that the cost-price of a solar cell may be considerably lower than the cells of monocrystalline material manufactured according to conventional methods, first of all due to the reduction of the number of operations and, furthermore, because it is possible to obtain elements of larger area. For very large areas drops may be released from a number of locations, suitably distributed above the substrate surface.

The invention will be described in greater detail with reference to the accompanying drawing.

Figure 1:
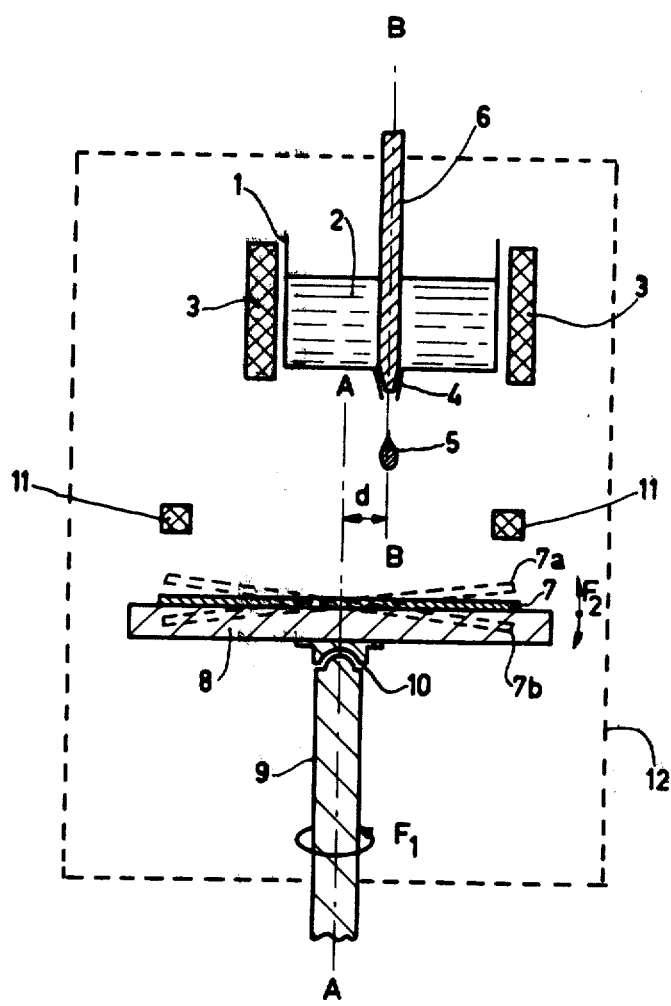
FIG. 1 shows diagrammatically a device for providing a layer of solid material on a substrate.

In the device shown in FIG. 1 the material from which a layer of solid material is to be obtained is provided in a crucible 1 in which it is heated by means of heating elements 3, to a temperature which is sufficiently high to form a liquid mass 2 from it.

A conical nozzle 4 is provided at the lower end of the crucible 1 in such manner that the liquid material 2 can flow in the form of drops 5. A vertically movable cock 6 the lower end of which has such a profile as to fit in the nozzle 4, permits of either closing the nozzle, or controlling the drop frequency of the said drops by adjusting the height of its end in the nozzle.

The crucible 1 preferably performs a rotating movement so as to keep the liquid mass 2 homogeneous.

The drops 5 are received on a flat substrate 7 which performs a rotating movement about the axis AA which is transmitted to said substrate by a turntable 8 on which the said substrate 7 is present, said turntable 8 itself being rotated by the spindle 9 which rotates, for example, in the direction denoted by the arrow $F_1$.

The mechanical connection between the said turntable 8 and the said spindle 9 may be given a certain flexibility shown diagrammatically by a ball joint 10, so that the regular rotating movement of the substrate 7 can be combined with a tilting movement of said substrate which enables the latter to oscillate on either side of a substantially horizontal plane. This tilting movement is shown in FIG. 1 by the double arrow $F_2$; the angle of tilt thereof that is the angle between the two planes which corresponds to the highest dead point (for example, when the substrate 7 is in the position 7a denoted in broken lines) and the lowest dead point (for example, when the substrate 7 is in the position 7b denoted in broken lines) of the said tilting movement, is preferably between 3° and 10°. This movement can be produced, for example, by means of local jets of gas against the lower side of the turntable 8 in places eccentrically of the axis AA by means of gas supply tubes provided for that purpose (not shown).

The spindle 9 and the crucible 1 are arranged so that a certain distance d is adjusted between the substantially vertical axis AA about which the rotation of the substrate is carried out and the vertical track BB according to which the drops fall.

The device furthermore comprises a heating element 11 which is preferably provided, as is shown in FIG. 1, above the edge of the substrate 7. The temperature of the substrate 7 may thus be adjusted and the duration of the crystallization thus be controlled.

Furthermore, said heating element 11, due to the delaying effect it exerts on the crystallization, permits of using a number of successive drops for the manufacture of a single layer of solid material.

The assembly of the device is accomodated in a vessel, through which a suitable gas flows; the vessel is indicated diagrammatically by the rectangle 12 omitting any reference regarding passages or flow tubes for the gas.

As a variation of the means for moving the substrate 7 described with reference to FIG. 1, the means for transmitting the movements of which in FIG. 1 the spindle 9 and the ball joint 10 are shown may be replaced by the device shown in FIG. 2.

Figure 2:
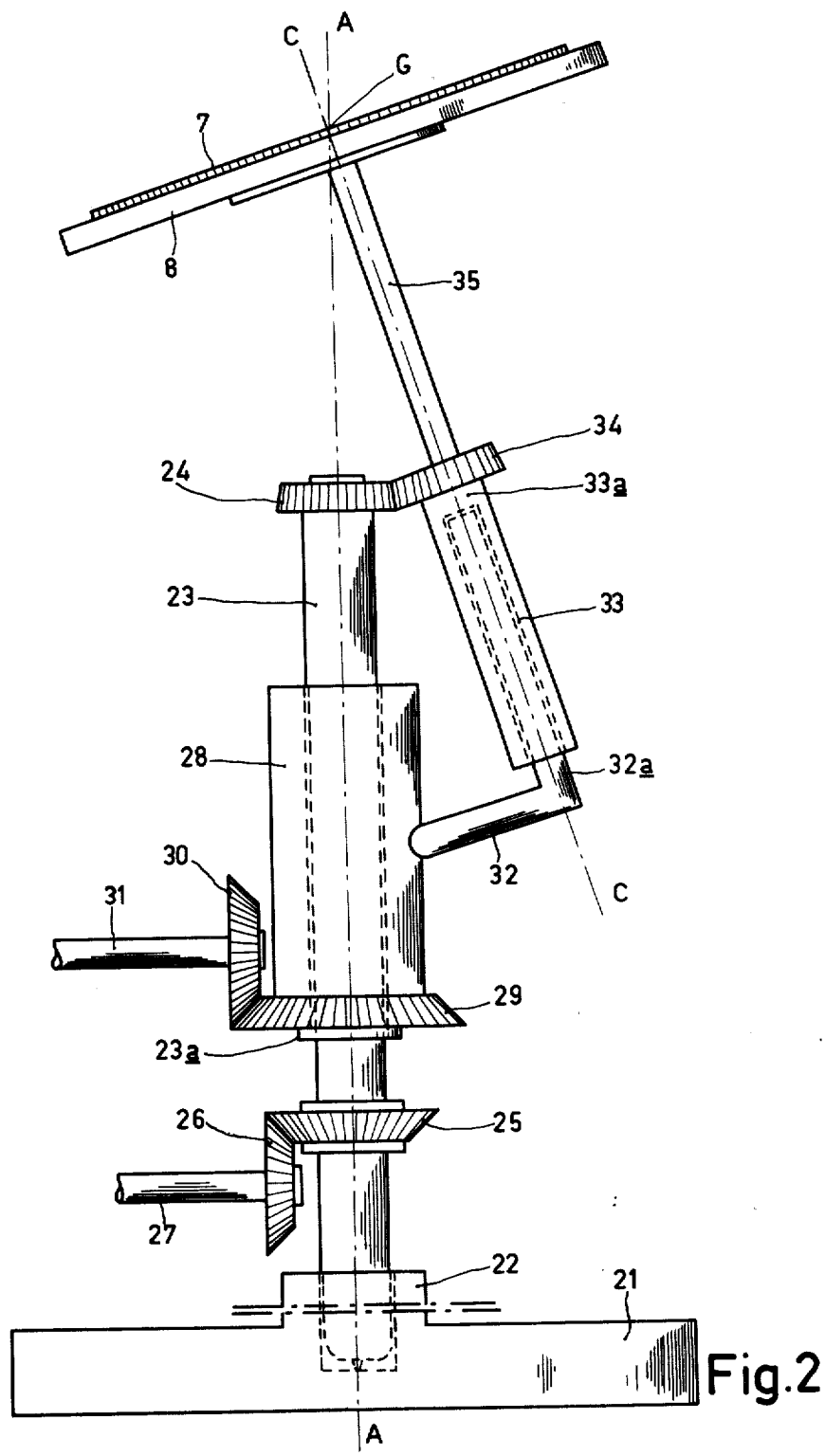
FIG. 2 shows diagrammatically a device for the combination of a rotating movement and another periodic movement of a flat substrate which is to be covered with a layer of solid material.

The device shown in FIG. 2 bears, for example, on a horizontal supporting block 21 the central part of which comprises a sleeve 22 in which the lower end of a vertical spindle 23 which is capable of rotating freely about its vertical axis, is journalled and supported. The spindle 23 forms one assembly with two gear wheels: a first conical gear wheel 24 which is secured to the upper end of the spindle 23 and a second conical gear wheel 25 which is secured to a lower part of the said spindle 23. The conical gear wheel 25 together with a conical gear wheel 26 which is mounted on a shaft 27 of a motor not shown, constitutes a conical coupling for transmitting a rotating movement to the spindle 23.

A cyclindrical sleeve 28 is provided on the spindle 23 so as to be able to rotate freely about the spindle 23. At its lower end the sleeve 28 is journalled so as to be freely rotatable on a supporting collar 23a present on the spindle 23. Furthermore, the sleeve 28 is provided near its lower end with a conical gear ring 29 acting on a conical gear wheel 30, which gear wheel 30 is secured on the shaft 31 of a driving motor not shown. The sleeve 28 has a lateral arm 32 with a slanting cylindrical portion 32a which encloses an acute angle with the spindle 23, the respective axes CC and AA of the lateral two elements intersecting each other in a point G which is situated above the gear wheel 24. Arranged on the portion 32a of the arm 32 is a cylindrical sleeve 33 which is closed at its upper end and can rotate freely about the said portion 32a which both supports and journals the sleeve.

The cylindrical sleeve 33 has a conical gear wheel 34 at its upper end and is elongated there by a spindle 35 which is coaxial with the sleeve 33.

The conical gear wheel 24 on the spindle 23 engages in the conical gear wheel 34. The spindle 35 supports the turntable 8 the upper surface of which is at right angles to the axis CC. A graphite plate 7 which forms the substrate on which the material to be crystallized is provided, is laid on said upper surface of turntable 8. The centre of the upper surface of the plate 7 substantially coincides with the point of intersection G of the axes AA and CC, so that both upon rotation of the sleeve 28 and upon rotation of the spindle 35 the centre of the upper surface of the plate 7 does substantially not change position.

In principle the described device has three mutually cohering composed parts which can perform different movements, namely 1. the spindle 23 with the gear wheels 24 and 25,
2. the sleeve 28 with the gear wheel 29 and the arm 32,
3. the sleeve 33 with the gear wheel 34, the spindle 35, the turntable 8 and the plate 7.

The movement of the turntable 8 and of the plate 7 is hte result of both the rotating movement of the arm 32 by rotation of the sleeve 28 about the spindle 23, and the rolling of the gear wheel 34 about the gear wheel 24 during said rotation.

If the spindle 23 and the sleeve 28 rotate in the same direction with the same angular speed, the gear wheels 24 and 34 remain engaging invariably. The plate 7 then rotates exclusively about the axis AA but not also about the axis CC. It varies its orientation in space but all the points thereof describe circle circumferences, the planes of which are parallel to each other and at right angles to the axis AA, so that in that case all the points of the surface to be covered remain at the same level.

If the axis 23 and the sleeve 28 have different and/or oppositely directed angular speed, the engagement between the gear wheel 34 and the gear wheel 24 varies. This variation of engagement causes a rotation of the plate 7 about the axis CC and consequently an oscillating variation of the height of each of the points of the surface of the said plate 7 to be covered, with the exception of the point G, with respect to the passage of the axis CC, in this case coinciding with the point G.

The ratio of the frequency of the oscillation in height of the points situated outside G of the substrate surface of the plate 7 (substrate) with respect to their rotation frequency in space depends on the respective angular speeds of the gear wheels 24 and 34.

By suitably controlling the direction and speed of rotation of the gear wheel 24 with a given direction and speed of rotation of the sleeve 28 about the spindle 23, it can even be achieved that the various points of the plate 7 stop rotating in space and only perform a regular movement from top to bottom and conversely. This is obtained, for example, in the case in which with equally proportioned gear wheels 24 and 34 the spindle 23 rotates in the same direction as the sleeve 28 at a speed of rotation which is equal to double that of the sleeve.

As a result of the rotating movement of the normal to the surface about the vertical the direction of flow of liquid in a given place of the substrate surface will always vary its direction so that in the last described case also a dropped liquid can spread over the whole substrate surface.

By way of example, the use of the device shown in FIG. 1, but with the movement device shown in FIG. 2, for providing a layer of silicon on a flat substrate will be described.

The substrate 7 of graphite is circular and has a diameter of 100 mm and a thickness of 100 μm. It is heated on the turntable 8 to a temperature between 1390° and 1410°; the heating element 11 is arranged at a height of 5 cm with respect to the centre of the substrate surface.

The height of the outlet of the nozzle 4 may be adjusted between 8 and 12 cm, measured from the centre of the substrate surface. The heating element 3 heats and maintains the silicon in the crucible 1 at a temperature which is higher than the melting temperature, for example 1430° C. A constant flow of argon is sent through the vessel 12. According to a modified embodiment a reduced gas pressure in the order of 16 mm mercury, for example also argon or another protective gas, may alternatively be used in the vessel.

The orientation of the substrate surface is varied by means of a rotation of the axis CC about the vertical axis AA with a frequency of 5 revolutions per second (300 rpm). These two axes which intersect each other in the point G in the centre of the surface of the substrate 7 to be covered enclose an angle of 3° with each other. Since the axis CC is also at right angles to the substrate surface, the substrate surface has an inclined position with an angle of 3° deviating from a horizontal position. Since the axis AA is vertical, the substrate surface in its various positions during the said periodic movement, will always deviate by an angle of 3° from the horizontal position. The said movement of the axis CC about the vertical axis AA is obtained by rotating the sleeve 28 at said speed of 300 rpm.

In order to vary the height of the points of the surface of the substrate situated outside the point G, the spindle 23 with the gear wheel 24 should not be rotated at the same speed of rotation (in the same direction) as the sleeve 29. Furthermore, it is desired that the horizontal speed of movement of the place on the substrate surface on which a drop of liquid material falls, is not too large so as to prevent harling away of the drop. In the present example a rotation about the axis CC is added in such manner that the points of the substrate surface situated beyond G perform rotations about the axis AA with a frequency of only 20 rpm. For this purpose the spindle 23 is rotated in the same direction as the sleeve 28 but with a frequency of 580 rpm (twice the frequency of the sleeve 28 reduced by the desired frequency of the revolutions of the points on the substrate surface).

The distance $d$ (see FIG. 1) between the track of the molten drops and the vertical axis AA is 20 mms.

The average volume of a drop 5 is 20 mm$^3$. 20 drops of molten silicon are allowed to fall on the substrate at a frequency of 3 drops per second.

In this manner a layer of polycrystalline silicon is provided on the whole upper surface of the plate 7 the thickness of which is uniform and equal to 50 μm and the crystallization of which is completed between 6 and 10 seconds after the last drop of the above-mentioned 20 drops has fallen. This layer adheres very intimately to the underlying graphite and has a strongly shining appearance which is an indication of a good homogeneity and purity.

The graphite plate 7 which is covered with the layer of polycrystalline silicon may be used for the manufacture of a solar cell dependent upon the extent to which said silicon has suitably been doped. For this purpose, a suitable quantity of dopant may previously be added to the quantity of liquid material 2. According to an embodiment, the dopant used is boron. The crystalline silicon of the resulting layer then has a p-type conductivity. Over a thickness of 0.3 μm, taken from the surface of the polycrystalline layer, a zone of n-conductivity is formed by diffusion of phosphorus, said zone forming a pn junction with the underlying p-type silicon. A contact with the n-type zone is provided on the surface of the said layer, while the other contact of the cell is provided on the uncovered surface of the graphite plate 7.

What is claimed is:

1. A method of providing a layer of solid polycrystalline semiconductor material on a flat substrate surface, for use as a solar cell in which a liquid material from which said solid polycrystalline semiconductor material is formed, is supplied dropwise to the substrate, while said substrate is given a rotating movement, characterized in that the rotating movement of said substrate is combined with at least one other periodic movement which produces a change of the position of the plane of said substrate surface, such that the points of the surface which are situated outside the point of intersection of the axis of the rotating movement change in height periodically with respect to said point of intersection.

2. A method as claimed in claim 1, characterized in that said other periodic movement has a frequency other than that of the rotating movement.

3. A method as claimed in claim 2, characterized in that said other periodic movement has a larger frequency than that of the rotating movement.

4. A method of claim 1, characterized in that the axis of the rotating movement, remains at right angles to the substrate surface and the said other periodic movement varies the position of the axis of the rotating movement.

5. A method of claim 1, characterized in that said other movement is a tilting movement.

6. A method as claimed in claim 5, characterized in that the maximum angle of tilt is chosen to be between 3° and 10°.

7. A method as claimed in claim 4, characterized in that said other movement is a rotating movement about an axis which encloses an angle with the normal of the substrate surface.

8. A method as claimed in claim 7, characterized in that the angle of the axis of said other rotating movement to the normal of the substrate surface is chosen to be between 1.5° and 5°.

9. A method of claim 1, characterized in that the place where the liquid material is dropped on the substrate surface, is situated outside the axis of the rotating movement.

10. A method as claimed in claim 9, characterized in that said substrate is circular and the distance on said substrate surface between the axis of the rotating movement and the average point of impact of a drop of the liquid material is at least 1/10 of the diameter of said substrate surface.

11. A method as claimed in claim 10, characterized in that said distance is at least 1/5 of the diameter of the substrate surface.

12. A method as claimed in claim 10, characterized in that the said distance is at most ⅓ of the diameter of said substrate surface.

13. A method as claimed in claim 12, characterized in that the said distance is at most ¼ of the diameter of said substrate surface.

14. A method of claim 1, characterized in that the liquid material consists of a melt of said solid material.

15. A method as claimed in claim 1, characterized in that the semiconductor material is silicon.

16. A solar cell, having a body of semiconductor material obtained by using a method as claimed in claim 1.

* * * * *